United States Patent [19]

Elms

[11] Patent Number: 5,587,917
[45] Date of Patent: Dec. 24, 1996

[54] DATA COLLECTION AND PROCESSING FOR DIGITAL AC POWER SYSTEM MONITOR/ANALYZER

[75] Inventor: Robert T. Elms, Monroeville, Pa.

[73] Assignee: Eaton Corporation, Cleveland, Ohio

[21] Appl. No.: 325,711

[22] Filed: Oct. 17, 1994

[51] Int. Cl.$^6$ ................................................ G01R 21/06
[52] U.S. Cl. ........................ 364/487; 364/483; 364/492
[58] Field of Search .................................. 364/483, 482, 364/481, 492, 487; 324/142, 133, 76.11, 76.21, 76.24

[56] References Cited

U.S. PATENT DOCUMENTS

| | | | |
|---|---|---|---|
| 4,672,555 | 6/1987 | Hart et al. | 364/481 X |
| 4,709,339 | 11/1987 | Fernandes | 364/492 |
| 5,224,054 | 6/1993 | Wallis | 364/483 |
| 5,233,538 | 8/1993 | Wallis | 364/483 |
| 5,247,454 | 9/1993 | Farrington et al. | 364/483 |
| 5,406,495 | 4/1995 | Hill | 364/492 X |

Primary Examiner—Emanuel T. Voeltz
Assistant Examiner—Kamini Shah
Attorney, Agent, or Firm—Martin J. Moran

[57] ABSTRACT

A digital monitor/analyzer for an ac electrical power system samples the current and voltage waveforms at a slow rate for performing metering functions, and at a high rate for analyzing harmonic content. Sampling is performed in sampling frames comprising a plurality of repetitions of sampling for a selected number of cycles followed by a delay of a fraction of a cycle. This effects equivalent sampling at a higher rate for slow speed sampling over a frame. High speed sampling is performed over only one repetition of the selected number of cycles in a frame so that it can be carried out sychronously as required for the harmonic analysis. The high speed sampling rate is an integer multiple of the slow speed rate so that slow speed data can be extracted from the high speed samples for continuous metering. Fourier analysis of the harmonic content of the waveforms is performed on the odd interrupts while all of the other tasks are apportioned out over the even interrupts of a sampling frame. Both the odd and even interrupts initiate sampling.

16 Claims, 4 Drawing Sheets

DATA COLLECTION AND PROCESSING FOR DIGITAL AC POWER SYSTEM MONITOR/ANALYZER

BACKGROUND OF THE INVENTION

1. Field of the Invention

This invention relates to data collection and processing of that data in digital apparatus which performs metering functions and can also perform harmonic distortion analysis of the waveform in an ac electrical power system.

2. Background Information

State of the art monitors for ac power systems incorporate microcomputers for calculating various electrical parameters such as rms currents and voltages, peak currents and voltages, power, energy, power factor, and the like. Typically, the sampling rate at which the analog waveforms of the electrical power system are digitized for input to the microprocessor is a compromise between the high sampling rate desired for increased accuracy, and lower rates imposed by computing time needed for the processor to calculate the various electrical parameter desired as outputs.

Waveform analyzers are used for oscillographic analysis of the waveforms in the ac electrical power system and can also be used to determine the harmonic content of the waveform. In accordance with the well known Nyquist criteria, a signal must be sampled at twice the highest frequency to be detected. Thus, a waveform must be sampled at twice the frequency of the highest harmonic to be extracted. For example, a 60 Hz ac signal must be sampled at least at 6 KHz in order to extract the 50th harmonic. This high sampling rate places a burden on the microcomputer. In fact, in one monitor/analyzer, only the monitoring function such as calculation of the various voltages and currents, power and the like are performed in the microcomputer of the device. The raw digital waveform data is sent to a remote computer with greater computing capacity for performing the harmonic analysis.

State of the art circuit breakers also utilize microcomputers in the trip unit. Such digital trip units can perform monitoring functions in addition to the protection functions. Some of these circuit breakers employ what is known as an equivalent sampling technique to increase accuracy without placing an undue burden on the microprocessor. In the equivalent sampling technique, the ac waveforms are sampled a selected number of times per cycle with a delay of a fraction of a cycle before another cycle of samples is taken at the same sampling rate. Thus, the sampling instants are "bumped" each cycle by the selected fraction of a cycle. The data collected over a number of such "bumped" cycles are then used to calculate the various parameters. For instance, if a sampling rate of 16 samples per cycle is used, an effective rate of 64 samples per cycle can be realized by sampling for one cycle, delaying for 1/64 of a cycle and then taking another 16 samples at the rate of 16 samples per cycle. This is repeated until four cycles of data are accumulated; however, 4 1/16 cycles are required to generate this data. Thus, this is not synchronous sampling, but then synchronous sampling is not necessary to perform the monitoring and protection functions.

However, sampling must be synchronous in order to perform the Fourier analysis used for calculating harmonic distortion. By synchronous sampling, it is meant that an integer number of samples are taken per cycle. In addition, as mentioned above, a high sampling rate is required to detect the full range of harmonic information needed to make the harmonic analysis. At the same time, the Fourier analysis of that data requires a considerable amount of computation time. The result is that a very high demand is placed upon the microcomputer, especially if extensive monitoring is also to be performed by the device.

There is a need therefore, for a digital monitor/analyzer for ac power systems which can perform harmonic distortion analysis internally and also perform extensive monitoring functions.

In particular, there is a need for such an improved digital monitor/analyzer which can sample the ac waveforms at a high enough rate to obtain the data needed for a full harmonic distortion analysis and at the same time have enough computational time for performing that analysis while also performing extensive monitoring calculations.

SUMMARY OF THE INVENTION

These needs and others are satisfied by the invention which is directed to electrical apparatus for use with an ac electrical power system in which sampling of the ac waveforms is performed at a first, slow, sampling rate for gathering the data for the monitoring or protection functions, and sampling at a second, higher, sampling rate to digitize the waveforms for harmonic distortion analysis. A form of equivalent sampling is used for the slow sampling, while synchronous sampling is used during high speed sampling to meet the requirements for Fourier analysis of the harmonic content of the waveforms. Normally, sampling is performed at the slow rate; however, momentary sampling at the high speed rate can be implemented automatically upon the occurrence of particular events, on manual command, or at specified times.

The two sampling rates are implemented through organizing the sampling into sampling frames each of which comprises a predetermined number of repetitions of sampling for a selected number of cycles followed by a delay of a fraction of a cycle. Sampling at the high speed rate is performed in no more than one repetition of the selected number of cycles during a sampling frame. Thus, equivalent sampling is used for sampling at the slow speed rate during the sampling frame, while the high speed sampling, if used during a frame, is performed synchronously. Preferably, the high speed sampling is performed at a rate which is an integer multiple of the slow speed rate, so that slow speed data can be extracted from the high speed data for continuous calculation of the monitored electrical parameters.

In the exemplary embodiment of the invention, a sampling frame comprises four repetitions of sampling for two cycles at 32 samples per cycle with a fractional delay of 1/128th of a cycle between repetitions. Thus, a frame requires 8 1/32 cycles, providing an equivalent sampling rate of 128 samples per cycle. The high speed sampling is performed at 128 samples per cycle, which being four times the slow speed sampling rate, permits samples at the rate of 32 per cycle to be extracted from the high speed data.

As mentioned, considerable computation time is required for Fourier analysis of the harmonic content of the waveforms. As another aspect of the invention, the tasks performed by the microcomputer are allocated to provide this computational time for the harmonic analysis while still devoting sufficient computational time to monitoring so that a full spectrum of parameters can be tracked. Periodic interrupts which initiate sampling also regulate the performance of the calculations carried out by the microcomputer. Specific tasks are assigned to be performed at specified interrupts throughout the sampling frame. The Fourier analysis computations are broken down into smaller steps which are performed on each of either the odd or even interrupts during a sampling frame. All of the other functions performed by the microprocessor are allocated to the other of the odd or even interrupts. The data gathered during one sampling frame are processed during the next sampling frame. As there are 32 samples per cycle, there are 16 interrupts available during each cycle for calculating harmonics and 16 interrupts for performing the other functions, such as monitoring and/or protection. There are six guaranteed cycles available in each sampling frame during which tasks can be performed (high speed sampling may be performed during two cycles). Thus, at 16 tasks per cycle, there are 96 different task slots available. In accordance with the invention, the tasks to be performed are partitioned out over these 96 task slots available during a sampling frame.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
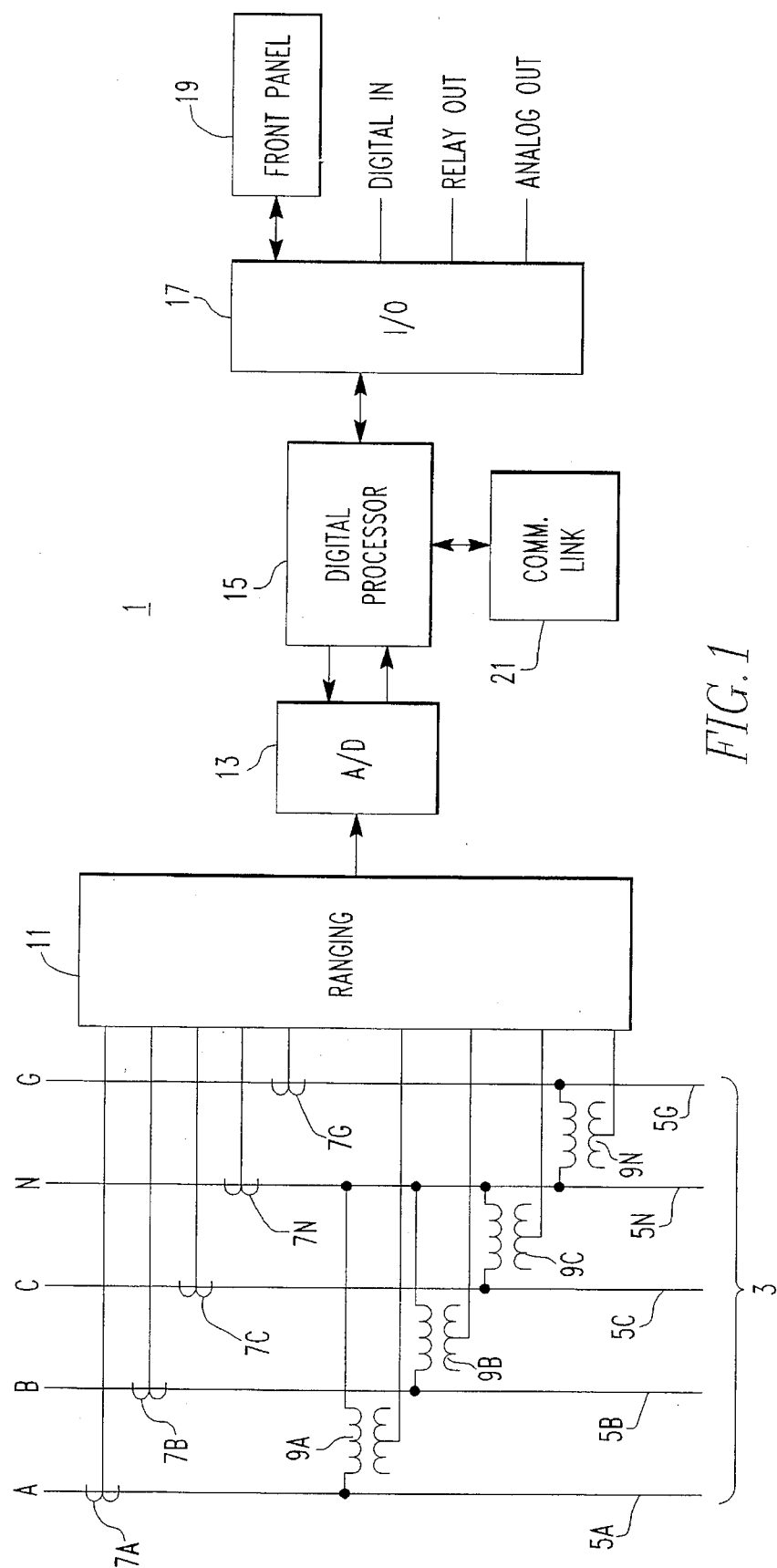
FIG. 1 is a block diagram of a monitor/analyzer in accordance with the invention.

As shown in FIG. 1 the monitor/analyzer 1 of the invention is used to monitor and analyze an ac electrical power system 3 such as a power distribution system. The power distribution system 3 illustrated has three phase conductors 5A, B and C, a neutral conductor 5N and a ground conductor 5G. Current transformers 5A, B, C, N and G sense current flowing in each of these conductors while phase to neutral voltages are sensed by the potential transformers 9A, B, and C, and neutral to ground voltage is caused by transformer 9N. A ranging circuit 11 converts the current and the voltage signals from −10 to 0 to +10 volt signals for conversion by analog to digital (A/D) converter 13 for input to a digital processor 15. The A/D converter 13 samples the analog voltages and currents at sampling rates determined by interrupts generated by the digital processor 15. These interrupts are generated selectively at a first, slow speed sampling rate, or a second, high speed sampling rate. In the exemplary device, the slow speed sampling rate is 32 samples per cycle and the high speed rate is 128 samples per cycle. During low speed sampling, the A/D converter 13 samples all five currents and all four voltages. For high speed sampling, again all currents are sampled, but only the three phase voltages are digitized for input to the processor. Each of these currents and voltages is sampled on each interrupt.

The digital processor 15 utilizes the data generated by these digital samples to generate values of two sets of electrical parameters. The first set of parameters is related to the monitoring function and includes metered parameters such as: rms currents and voltages, peak currents and voltages, minimum currents and voltages, power factor, watts, Vars, volt-amps, total harmonic factor, K-factor, CBMEA derating factor, and the like. The second set of parameters calculated by the digital processor 15 are the individual harmonic coefficients. The present invention organizes data collection and processing so that a maximum number of parameters can be monitored continuously while also providing the capability for simultaneous calculation of harmonic content.

The digital processor 15 has an input/output (I/O) 17 through which the processor 15 is connected to a front panel 19. The front panel 19 serves as the interface with the user. It is through the front panel that the user can control the operation of the monitor/analyzer 1 and monitor the ac electrical power system 3. The input/output device 17 also interfaces the digital processor 15 with contact inputs through a digital input. Relay outputs and analog outputs are also provided through the input/output device 17. The digital processor 15 can also communicate with a remote processor through a communications link 21. Through this communications link 21 the monitor/analyzer 1 can provide information to and/or be controlled by a remote processor (not shown).

Figure 2:
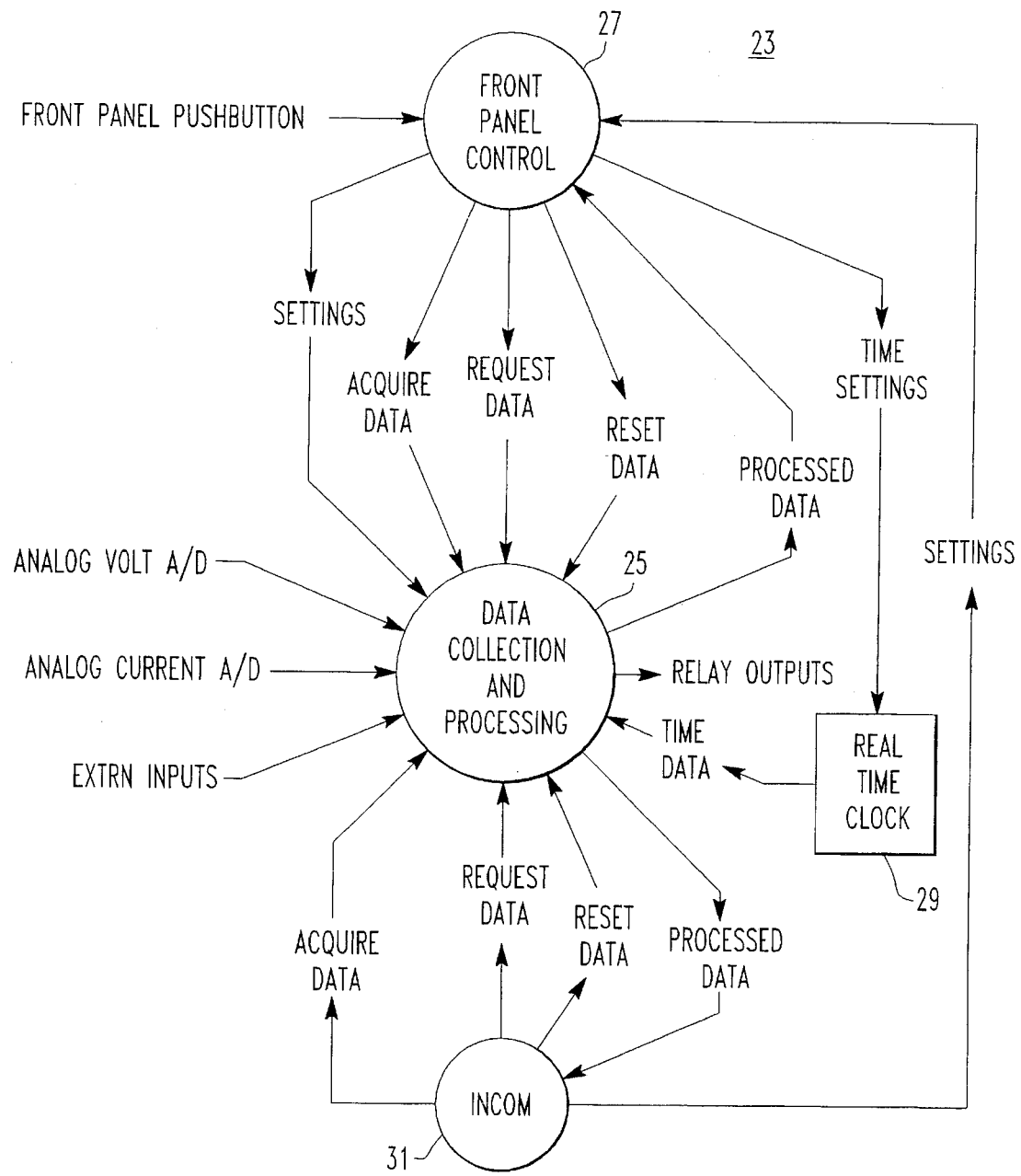
FIG. 2 is a data flow diagram for the apparatus illustrated in FIG. 1.

FIG. 2 illustrates a data flow diagram 23 or the monitor/analyzer 1 shown in FIG. 1. The sensed analog voltages and current are converted to digital signals for input to the data collection and processing function 25 where the data is processed in accordance with settings received from a front panel control 27. Such settings are input to the control 27 through front panel push buttons. These push buttons can also be used to request data and to acquire it for a display on the front panel when available. Data collection and processing is performed using time data provided by a real time clock 29 which can be set from the front panel. External inputs such as contact closures are also processed. In addition to providing information for display on the front panel, data can be exchanged with a remote computer through a communications link such as the Incom® network 31 or any other suitable communications link. This provides the capability for the monitor/analyzer 1 to interface with a remote unit in the same manner that it interfaces with the front panel. In addition to providing outputs to the front panel and through the communications link to a remote unit, relay outputs can also be generated.

Figure 3:
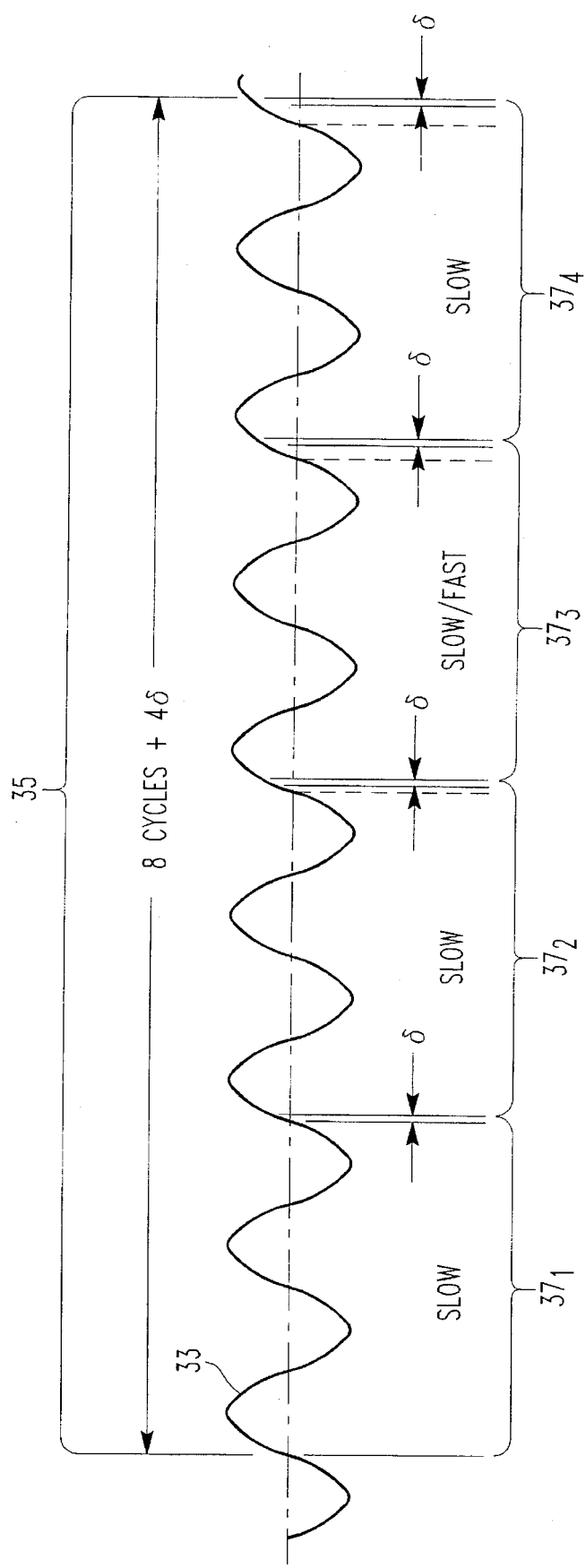
FIG. 3 is a diagram illustrating the technique of sampling an ac power waveform in accordance with the invention.

FIG. 3 illustrates the sampling technique utilized in accordance with the invention. As mentioned, two sampling rates are used. In addition, equivalent sampling is employed with the slow speed sampling in order to improve accuracy. Equivalent sampling at low speed with selectable high speed sampling, is implemented by sampling in frames. Each sampling frame 35 comprises repetitions $37_1$–$37_4$ of sampling for a selected number of cycles followed by a delay δ, which is a fraction of a cycle. In the exemplary system, the selected number of cycles is 2 and the frame constitutes four repetitions of $37_1$–$37_4$ sampling for two cycles followed by a delay δ. Thus, the exemplary frame 35 is equal to eight cycles +4δ. In the exemplary system, the slow speed sampling rate is 32 samples per cycle and δ is made equal to 1/128 of a cycle so that the sampling frame 35 is equal to 8 1/32 cycles of the fundamental waveform 33. This provides an equivalent sampling rate of 128 samples per cycle.

High speed sampling can be implemented in any one of the repetitions $37_1$–$37_4$, but only one, during a sampling frame 35. Thus, for instance, in the exemplary device, high speed sampling, when called for, is implemented in the third repetition $37_3$ within the frame 35. Any one of the frames can be used for high speed sampling, but it is always the same repetition. Since high speed sampling is performed for only one repetition, the sampling can be synchronous, a requirement for Fourier analysis of the harmonic content of the waveform. By synchronous it is meant that an integer number of samples are taken per cycle. As the delay, δ, comes at the end of the repetition it does not disturb the synchronous sampling performed during only one repetition. The high speed sampling is carried out at a rate which is an integer multiple of the slow speed rate. In the exemplary embodiment, the high speed rate is 128 samples per cycle which is four times the slow speed rate. This permits the slow speed data to be extracted from the high speed data, so that continuous data is available for the calculations performed using the slow speed sampling.

While the selected number of cycles in each repetition 37 is two in the exemplary embodiment, other numbers of cycles can be used. However, the number of cycles selected for each repetition sets the maximum number of cycles of high speed data that can be collected during a frame. Two cycles provides some averaging which would not be available if only one cycle of high speed data were collected. On the other hand, if the selected number of cycles is greater than two, the length of the frame is extended which can reduce the response to changes in amplitude of the waveforms which is pertinent to the monitoring function. A different number of repetitions 37 in the frame 35 can also be used; however, fewer repetitions would decrease the resolution of the equivalent sampling, and again an increased number of repetitions would decrease the response of calculations to changes in amplitude.

The sampling at the high speed rate can be implemented automatically in response to conditions in the ac electrical power distribution system 3, such as for instance an overcurrent condition, a trip, a low voltage condition, or the like. In addition, high speed sampling can be commanded through the front panel or remotely through the communications link. Also, high speed sampling can be initiated by a timer. In any case, and especially in the case of an automatic response to an abnormal condition, high speed sampling can be performed in a series of successive sampling frames, and in the exemplary system, up to seven successive frames.

In order to perform the Fourier analysis, one-half of the computation time available in the microprocessor is assigned to perform that function. These computations, which generate values for the individual harmonics as a percentage of the fundamental for the analyzed waveforms, are only performed during the slow speed sampling. Thus, alternate interrupts, for instance the odd interrupts, initiate analog to digital conversion, and also trigger the computations for the Fourier analysis. The remaining tasks are assigned to the even interrupts, which also initiate analog to digital conversions. Table 1 illustrates the exemplary assignment of tasks to the even interrupts. As the slow sampling rate is 32 samples per cycle, there are 16 even interrupts per cycle to which tasks can be assigned. While there are eight cycles in a frame, only six of those cycles are guaranteed as being available to perform tasks since the other two cycles must be available for high speed sampling. Therefore, there are 16×6=96 task slots always available during a frame. There are 16×2=32 additional task slots that will be available if there is no high speed sampling during the frame. Tasks of lesser importance, or requiring less frequency of updating, are assigned to these latter, conditional task slots. While in the exemplary system, fast sampling is performed during the third repetition, $37_3$, during a frame, it is the task slots assigned to the last repetition, $37_4$, which are eliminated during a high speed sampling frame. Thus, the tasks assigned to even interrupts are delayed by high speed sampling, and those which normally would have been performed during the third repetition, $37_3$, are instead performed during the fourth repetition $37_4$. It will be noticed from FIG. 4 that the tasks performed include calculation of total harmonic distortion (THD). These calculations are performed on the even interrupts, as they are simple calculations which only require data generated by low speed sampling the tasks performed during any given frame utilize data collected from the previous frame.

TABLE 1

INTERRUPT TASK ASSIGNMENTS

| Task | Int # | Cyc | Function |
|---|---|---|---|
| 0 | 0 | 0 | DO Current and Voltage 2 Cycle Detection |
|   |   | 1 | DO Min. Max Voltages |
|   |   | 2 | DO Current and Voltage 2 Cycle Detection |
|   |   | 3 | DO Displacement PF Phase A |
|   |   | 4 | Do Current and Voltage 2 Cycle Detection |
|   |   | 5 | DO Appar. PF Syst. & Phases & Dist. Volt. |
|   |   | 6 | DO Current and Voltage 2 Cycle Detection |
|   |   | 7 | DO VFloat Check |
| 1 | 2 | 0 | DO Square Root of IBRMSQ |
|   |   | 1 | Save Peak and Get Crest Factor |
|   |   | 2 | Get Analog Output Scale Factors |
|   |   | 3 | DO Analog Output 1 |
|   |   | 4 | DO Analog Output 2 |
|   |   | 5 | DO Analog Output 3 |
|   |   | 6 | X |
|   |   | 7 | X |
| 2 | 4 | 0 | DO Square Root of ICRMSQ |
|   |   | 1 | DO Square Root of 'VCA' Fundamental |
|   |   | 2 | DO THD VCA |
|   |   | 3 | DO KW-HR System |
|   |   | 4 | DO KVAR-HRS System |
|   |   | 5 | DO KVA-HRS System |
|   |   | 6 | DO THD VCA |
|   |   | 7 | X |
| 3 | 6 | 0 | DO Square Root of INRMSQ |
|   |   | 1 | Pulse Initiator Sums & Outputs as Needed |
|   |   | 2 | DO Demand Current, IA, IB, IC |
|   |   | 3 | DO Demand Watts System & Phases A, B, C |
|   |   | 4 | DO Demand VARS System & Phases A, B, C |
|   |   | 5 | DO Demand VA System & Phases A, B, C |
|   |   | 6 | X |
|   |   | 7 | X |
| 4 | 8 | 0 | DO Square Root of IGRMSQ |
|   |   | 1 | DO Square Root 'IA' Fundamental |
|   |   | 2 | DO THD IA |
|   |   | 3 | DO Unbalance and Analog Input |
|   |   | 4 | DO Min/Max Apparent Power Factor |
|   |   | 5 | DO V&I Ranging Check |
|   |   | 6 | DO THD IA |
|   |   | 7 | X |
| 5 | 10 | 0 | DO Square Root of VANRMSQ |
|   |   | 1 | DO Square Root 'IB' Fundamental |
|   |   | 2 | DO THD IB |
|   |   | 3 | DO Displacement PF, System |
|   |   | 4 | DO Displacement PF Phase B |
|   |   | 5 | DO Min/Max Displacement Power Factor |
|   |   | 6 | DO THD IB |
|   |   | 7 | X |
| 6 | 12 | 0 | DO Square Root of VBNRMSQ |
|   |   | 1 | DO Square Root 'IC' Fundamental |
|   |   | 2 | DO THD IC |
|   |   | 3 | DO Pulse Initiator Output As Needed |
|   |   | 4 | DO Displacement PF Phase C |
|   |   | 5 | DO Min. Max. Currents |
|   |   | 6 | DO THD IC |
|   |   | 7 | DO Pulse Initiator Output As Needed |
| 7 | 14 | 0 | DO Square Root of VCNRMSQ |
|   |   | 1 | DO Square Root 'IN' Fundamental |
|   |   | 2 | DO THD IN |
|   |   | 3 | DO Min/Max Percent THD |
|   |   | 4 | DO Phase Reversal Detection |
|   |   | 5 | X |
|   |   | 6 | DO THD IN |

TABLE 1-continued

INTERRUPT TASK ASSIGNMENTS

| Task | Int # | Cyc | Function |
|---|---|---|---|
|  |  | 7 | X |
| 8 | 16 | 0 | DO Square Root of VABRMSQ |
|  |  | 1 | DO Square Root of 'IG' Fundamental |
|  |  | 2 | DO THD IG |
|  |  | 3 | DO CBEMA and K-Factor Calculations |
|  |  | 4 | X |
|  |  | 5 | X |
|  |  | 6 | DO THD IG |
|  |  | 7 | X |
| 9 | 18 | 0 | DO Square Root of VBCRMSQ |
|  |  | 1 | DO Square Root 'VAN' Fundamental |
|  |  | 2 | DO THD VAN |
|  |  | 3 | Scale Watt |
|  |  | 4 | X |
|  |  | 5 | X |
|  |  | 6 | DO THD VAN |
|  |  | 7 | X |
| 10 | 20 | 0 | DO Square Root of VCARMSQ |
|  |  | 1 | DO Square Root of 'VBN' Fundamental |
|  |  | 2 | DO THD VBN |
|  |  | 3 | SCALE VAR |
|  |  | 4 | X |
|  |  | 5 | X |
|  |  | 6 | DO THD VBN |
|  |  | 7 | DO Discrete Input Resets |
| 12 | 24 | 0 | DO Square Root of VGNRMSQ |
|  |  | 1 | DO Square Root of 'VCN' Fundamental |
|  |  | 2 | DO THD VCN |
|  |  | 3 | Scale VA |
|  |  | 4 | Scale System Watts, VARS and VA |
|  |  | 5 | X |
|  |  | 6 | DO THD VCN |
|  |  | 7 | Check Min/Max 'Set O' Resets |
| 12 | 24 | 0 | DO Square Root of IARMSQ |
|  |  | 1 | DO Square Root 'VAB' Fundamental |
|  |  | 2 | DO THD VAB |
|  |  | 3 | DO Min/Max, VAR, VA |
|  |  | 4 | Check Min/Max 'Set 1' Resets |
|  |  | 5 | X |
|  |  | 6 | DO THD VAB |
|  |  | 7 | Check Min/Max 'Set 2' Resets |
| 13 | 26 | 0 | DO Min. Timer & VA Phases A, B and C |
|  |  | 1 | DO Square Root 'VBC' Fundmental |
|  |  | 2 | DO THD VBC |
|  |  | 3 | Check Min/Max 'Set 3' Resets |
|  |  | 4 | X |
|  |  | 5 | X |
|  |  | 6 | DO THD VBC |
|  |  | 7 | Check Min/Max 'Set 4' Resets |
| 14 | 28 | 0 | DO Input 1, 2, 3; Output Relay 1, 2, 3, 4 |
|  |  | 1 | Copy Event Header Info As Needed |
|  |  | 2 | DO Input 1, 2, 3; Output Relay 1, 2, 3, 4 |
|  |  | 3 | X |
|  |  | 4 | DO Input 1, 2, 3; Output Relay 1, 2, 3, 4 |
|  |  | 5 | Copy Event Heading Info As Needed |
|  |  | 6 | DO Input 1, 2, 3; Output Relay 1, 2, 3, 4 |
|  |  | 7 | Update Interrupt Timer Setpoints |
| 15 | 30 | 0 | Save RMS Currents and Voltages |
|  |  | 1 | Check Event Triggers |
|  |  | 2 | Check Non-Min/Max Reset Requests |
|  |  | 3 | Check Event Triggers |
|  |  | 4 | X |
|  |  | 5 | Check Event Triggers |
|  |  | 6 | Refresh Setting Values |
|  |  | 7 | Check Event Triggers |

There is certain processing, however, that is performed on each low speed sampling interrupt. This includes squaring the currents and voltages and adding the resultant value to a sum for calculation of the rms values. Similarly, the voltages and currents are multiplied together and summed for the power calculations. The set of data collected on a given interrupt is processed in this manner on the next interrupt. The cumulative results of this preprocessing during each frame are then saved for use in the performance of tasks requiring such data during the next frame. Thus, for instance, one of the tasks performed on the even interrupts is to determine the rms current by taking the square root of the sum of the squares accumulated during the previous frame.

While the slow speed sampling is performed at an equivalent sampling rate of 128 samples per cycle, in fact only 32 samples are taken in each cycle with the samples in each subsequent cycle delayed by the amount δ. On the other hand, a true 128 samples per cycle are taken during the high speed sampling. As this sampling rate is an integer multiple of the slow speed sampling rate, the slow speed sampling data is extracted from the high speed data. On each high speed interrupt the raw values of the currents and voltages are sampled and stored. Squaring and summing of the currents and voltages is only carried out for samples taken at every fourth sample during a high speed sampling. However, the processing of the currents and voltages to determine the squared sum is distributed over the four interrupts, as all of the processing does not have to be completed for each interrupt.

One of the tasks performed on the even interrupts is the determination of phase rotation. This is accomplished by calculating from the phase to neutral voltages, two of the phase-to-phase voltages. One of these phase-to-phase voltages is phase shifted 90 degrees. This phase shifted phase-to-phase voltage and the other phrase-to-phase voltage are multiplied together. The polarity of the result determines the phase rotation.

As synchronous sampling is required for the Fourier analysis used to determine harmonic content, the period of the ac power is calculated periodically so that the sampling interval can be adjusted if necessary to provide synchronous sampling. Such adjustment of the sampling interval is not made during high speed sampling to avoid skewing of the results.

Figure 4:
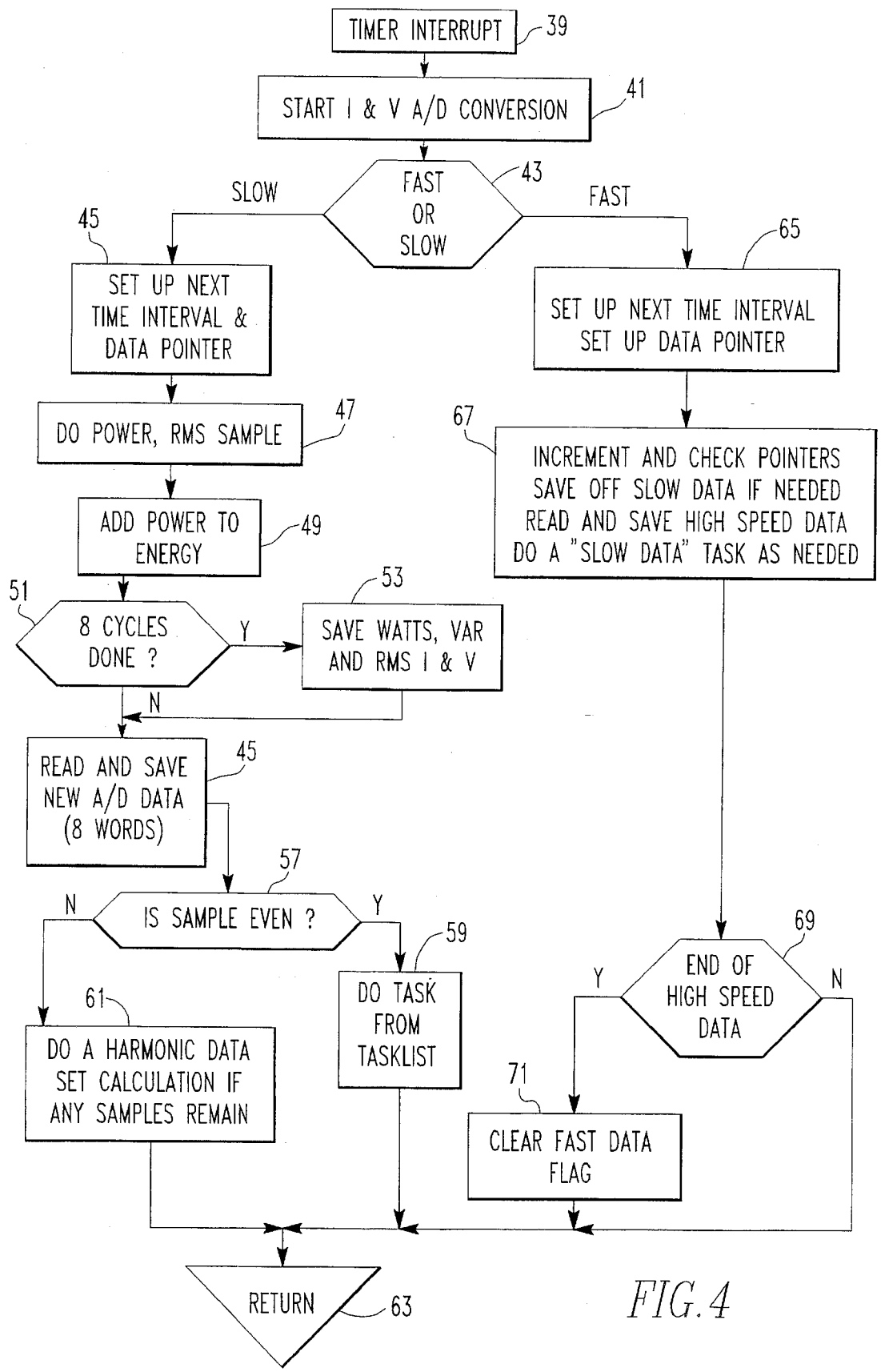
FIG. 4 is a flow chart for the timer interrupt routine for the microcomputer of the device shown in FIG. 1.

FIG. 5 is a flow chart for the timer interrupt routine 39 implemented by the digital processor 15. Each time this routine is called, analog to digital conversion of the currents and voltages is initiated at 41. If sampling is being performed at the slow rate as determined at 43, the time interval for the next slow interrupt is set and the pointers for storing the slow speed data are set at 45. The currents and voltages from the previous sample are then squared and the power calculation from the previous sample is performed at 47. The power calculation is then added to an energy summation at 49. When eight cycles have been completed as determined at 51, the processed values for this frame are saved at 53. Then, the digitized currents and voltages generated by the a/d converter on this interrupt are saved at 55. These are the values that will be used at 47 on the next slow interrupt to calculate the power and rms values. If this an even sample (interrupt) as determined at 57, then the appropriate task from the task list of FIG. 4 is performed at 59. If, on the other hand, this is an odd interrupt, a harmonic data set calculation is performed at 61. In either case, the routine is then exited at 63.

During high speed sampling, as determined at 43, the time for the next high speed interrupt and the data pointers for storing high speed data are set at 65. The pointers are incremented and checked at 67 and on every fourth high speed interrupt the slow speed data is saved. On each high speed interrupt, the high speed data is saved and the initial processing, such as squaring the currents or the voltages, is performed. If two cycles of high speed data have been collected as determined at 69, the FAST_DATA flag is reset at 71 so that the next time the timer interrupt routine 39 is called, slow speed sampling will be resumed.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. Electrical apparatus for use with an ac electrical power system, said apparatus comprising:

sensing means sensing waveforms in said ac electrical power system;

sampling means for selectively digitally sampling said waveforms sensed by said sensing means at a first sampling rate, or at a second sampling rate which is an integer multiple of said first sampling rate; and digital processing means determining values of first parameters of said waveforms from samples taken at said first sampling rate, or determining values of second parameters of said waveforms from samples taken at said second sampling rate, in the latter case said digital processing means extracting samples at said first sampling rate from samples taken at said second sampling rate such that said values of said first parameters are determined continuously.

2. The apparatus of claim 1 wherein said digital processing means comprises means processing a set of samples taken while a subsequent set of samples are being taken at said first sampling rate, and means for alternatively processing successive different samples in a set of samples extracted at said first sampling rate from samples taken at said second sampling rate on each of a plurality of subsequent samples taken at said second sampling rate before another set of samples is extracted at said first sampling rate.

3. Electrical apparatus for use with an ac electrical power system, said apparatus comprising:

sensing means sensing waveforms in said ac electrical power system;

sampling means digitally sampling said waveforms at a sampling rate determined by repetitive interrupts; and digital processing means generating said repetitive interrupts at a predetermined rate, and repetitively determining on one of odd or even interrupts values of a plurality of selected electrical parameters from samples taken of said waveforms by said sampling means, and repetitively determining on the other of said odd or even interrupts values of harmonic content parameters from said samples.

4. The apparatus of claim 3 wherein said digital processing means selectively generates interrupts at a first sampling rate and at a second sampling rate which is an integer multiple of said first sampling rate, said values of said selective plurality of electrical parameters being determined from samples taken at said first sampling rate and said values of said harmonic content parameters being determined from samples taken at said second sampling rate.

5. The apparatus of claim 4 wherein said digital processing means extracts samples at said first sampling rate from samples taken at said second sampling rate for use in continuously determining values of said selected electrical parameters.

6. The apparatus of claim 4 wherein values of different ones of said selected electrical parameters are determined on successive ones of said one of odd and even interrupts in a repetitive sequence.

7. The apparatus of claim 6 wherein said repetitive sequence extends over more than one cycle of said waveforms.

8. Electrical apparatus for use with a three-phase ac electrical power system, said apparatus comprising:

sampling means repetitively digitally sampling voltages in said three-phase as electrical power system at a rate greater than four samples per cycle to generate digital voltage samples; and digital processor means processing said digital voltage samples to generate a first phase-to-phase voltage signal which is phase shifted 90° from a second phase-to-phase voltage signal, multiplying said first and second phase-to-phase voltage signals together to generate a phase rotation signal indicating a first phase rotation when of a first polarity and indicating an opposite phase rotation when of a second polarity.

9. Electrical apparatus for use with an ac electrical power system, said apparatus comprising:

sensing means sensing waveforms in said ac electrical power system;

sampling means for digitally sampling waveforms in sampling frames each comprising a predetermined number of repetitions of sampling for a selected number of cycles of said ac waveform followed by delay of a fraction of a cycle of said waveforms, said sampling means selectively sampling for said selected number of cycles at a first sampling rate and at a second sampling rate which is greater than said first sampling rate with said second sampling rate being used for said selected number of cycles no more than once during a sampling frame;

digital processing means using samples taken at said first sampling rate over each sampling frame to determine values of first parameters of said waveforms, and using samples taken at said second sampling rate to determine values of second parameters of said waveforms; and said sampling means sampling at said second rate for said selected number of cycles for a specified repetition of sampling for said selected number of cycles during each of a designated number of successive sampling frames.

10. Electrical apparatus for use with an ac electrical power system, said apparatus comprising:

sensing means sensing waveforms in said ac electrical power system;

sampling means for digitally sampling waveforms in sampling frames each comprising a predetermined number of repetitions of sampling for a selected number of cycles of said ac waveform followed by delay of a fraction of a cycle of said waveforms, said sampling means selectively sampling for said selected number of cycles at a first sampling rate and at a second sampling rate which is greater than said first sampling rate with said second sampling rate being used for said selected number of cycles no more than once during a sampling frame;

digital processing means using samples taken at said first sampling rate over each sampling frame to determine values of first parameters of said waveforms, and using samples taken at said second sampling rate to determine values of second parameters of said waveforms; and said digital processor means determining values of said first parameters of said waveforms from samples taken at said first sampling rate during a previous sampling frame.

11. The apparatus of claim 10 wherein such digital processor means determines values of said second parameters while sampling at said first sampling rate using samples taken previously at said second sampling rate.

12. Electrical apparatus for use with an ac electrical power system, said apparatus comprising:

sensing means sensing waveforms in said ac electrical power system;

sampling means for digitally sampling waveforms in sampling frames each comprising a predetermined number of repetitions of sampling for a selected number of cycles of said ac waveform followed by delay of a fraction of a cycle of said waveforms, said sampling means selectively sampling for said selected number of cycles at a first sampling rate and at a second sampling rate which is greater than said first sampling rate with said second sampling rate being used for said selected number of cycles no more than once during a sampling frame;

digital processing means using samples taken at said first sampling rate over each sampling frame to determine values of first parameters of said waveforms, and using samples taken at said second sampling rate to determine values of second parameters of said waveforms; and said digital processing means comprising means processing a set of samples taken while a subsequent set of samples are being taken at said first sampling rate, and means processing successive different samples in a set of samples extracted at said first sampling rate from samples taken at said second sampling rate on each of a plurality of subsequent samples taken at said second sampling rate before another set of samples is extracted at said first sampling rate.

13. The apparatus of claim 12 wherein said second parameters comprise harmonic content parameters.

14. The apparatus of claim 12 wherein said second sampling rate is an integer multiple of said first sampling rate.

15. The apparatus of claim 13 Wherein said selected number of cycles is two cycles.

16. The apparatus of claim 15 wherein said predetermined number of repetitions is four.

* * * * *